US010078197B2

(12) United States Patent
Olsen

(10) Patent No.: US 10,078,197 B2
(45) Date of Patent: Sep. 18, 2018

(54) FOAM SANDWICH REFLECTOR

(71) Applicant: SPAWAR Systems Center Pacific, San Diego, CA (US)

(72) Inventor: Randall B. Olsen, Carlsbad, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/271,977

(22) Filed: Sep. 21, 2016

(65) Prior Publication Data

US 2018/0081147 A1  Mar. 22, 2018

(51) Int. Cl.
*G02B 5/10* (2006.01)
*G02B 7/183* (2006.01)
*H01L 31/054* (2014.01)
*H02S 40/22* (2014.01)
*G02B 19/00* (2006.01)

(52) U.S. Cl.
CPC ............... *G02B 7/183* (2013.01); *G02B 5/10* (2013.01); *G02B 19/0019* (2013.01); *G02B 19/0042* (2013.01); *H01L 31/0547* (2014.12); *H02S 40/22* (2014.12)

(58) Field of Classification Search
CPC ...... G02B 5/08; G02B 5/0808; G02B 5/0816; G02B 5/10; G02B 7/18; G02B 7/182; G02B 7/183; G02B 19/00; G02B 19/0019; G02B 19/0033; G02B 19/0042; H02S 40/20; H02S 40/22
USPC ........ 359/838, 846–848, 867, 871–875, 884, 359/883
See application file for complete search history.

(56) References Cited

U.S. PATENT DOCUMENTS

| 3,607,584 A | 9/1971 | Becht |
| 4,124,277 A | 11/1978 | Stang |
| 4,171,563 A | 10/1979 | Withoos |
| 4,226,657 A * | 10/1980 | Cottingham ............ B32B 15/08 156/196 |
| 4,307,150 A | 12/1981 | Roche |
| 4,343,533 A | 8/1982 | Currin |
| 4,469,089 A | 9/1984 | Sorko-Ram |

(Continued)

FOREIGN PATENT DOCUMENTS

| EP | 1946013 | 7/2008 |
| WO | WO 2002103256 | 6/2002 |

(Continued)

*Primary Examiner* — Robert E Tallman
(74) *Attorney, Agent, or Firm* — SPAWAR Systems Center Pacific; Kyle Eppele

(57) ABSTRACT

A foam sandwich reflector and a method for making a foam sandwich reflector. The reflector and method incorporate a foam slab having a top and bottom surface. Each of the top and bottom surface of the foam slab have a coating of an adhesive layer. The adhesive coating on the bottom surface of the foam slab is a lower bonding layer that bonds the foam slab to the bottom high modulus layer. The adhesive coating on the top surface of the foam slab is an upper bonding layer that bonds the foam slab to the top high modulus layer; bottom high modulus layer composed of a metal, e.g., aluminum or steel. The reflector and method also include an optically smooth, highly reflective high modulus layer. The reflector is curved in one dimension, and the curve is configured to concentrate light when the reflector is in use.

1 Claim, 9 Drawing Sheets

(56) References Cited

U.S. PATENT DOCUMENTS

| | | | |
|---|---|---|---|
| 5,151,827 A * | 9/1992 | Ven | F24J 2/1057 |
| | | | 359/848 |
| 7,077,532 B1 | 7/2006 | Diver, Jr. | |
| 2005/0168852 A1* | 8/2005 | Rudi | H01Q 15/142 |
| | | | 359/869 |
| 2011/0032629 A1* | 2/2011 | Brittingham, III | G02B 5/0808 |
| | | | 359/853 |
| 2011/0073102 A1 | 3/2011 | Hanson | |
| 2012/0206825 A1 | 8/2012 | Martinez Moll | |
| 2013/0114155 A1* | 5/2013 | Eguro | G02B 5/10 |
| | | | 359/853 |
| 2013/0283794 A1* | 10/2013 | Taillemite | B29C 37/0032 |
| | | | 60/641.15 |
| 2014/0160587 A1 | 6/2014 | Ainz Ibarrondo | |
| 2014/0233121 A1 | 8/2014 | Blomberg | |

FOREIGN PATENT DOCUMENTS

| | | |
|---|---|---|
| WO | WO 2012024738 A1 | 3/2012 |
| WO | WO 2013051999 A1 | 4/2013 |

\* cited by examiner

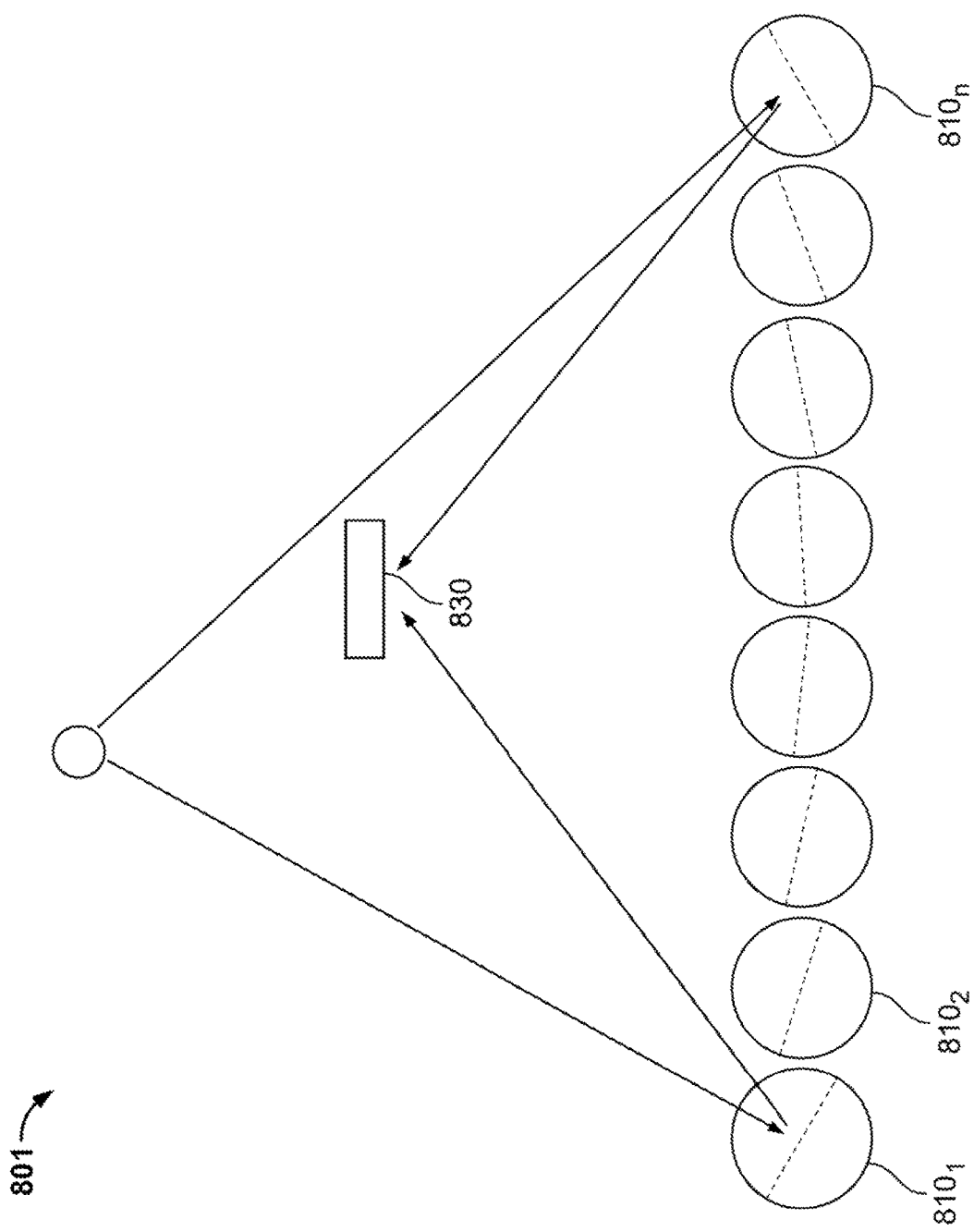

FOAM SANDWICH REFLECTOR

STATEMENT OF GOVERNMENT INTEREST

Federally-Sponsored Research and Development

The United States Government has ownership rights in this invention. Licensing inquiries may be directed to the Office of Research and Technical Applications, Space and Naval Warfare Systems Center, Pacific, Code 72120, San Diego, Calif., 92152; telephone (619)553-5118; email: ssc_pac_t2@navy.mil. Reference Navy Case No. 102,712.

BACKGROUND OF THE INVENTION

Field of Invention

This disclosure relates to solar energy, and more particularly, to reflectors for collecting solar energy.

Description of Related Art

Solar energy collection has become increasingly important. Solar energy is beneficial in that it does not require the use of the world's limited natural resources. Solar energy is also beneficial because it may be used to generate electricity with fewer environmental consequences than other media for generating electricity.

A variety of systems have been devised for the collection and utilization of solar energy. While many of these systems are quite efficient in accomplishing the objective, i.e. collecting and storing solar energy to supplement or replace more expensive systems utilizing common sources of energy, one primary problem remains. That problem is the initial cost of making and installing an efficient solar energy collecting system. If a solar energy collecting system is very expensive to make and install, such high capital expenditure is undesirable, since the potential user must wait too long to amortize this cost before realizing any savings in energy expense.

It is well known that solar energy may be converted into other useful forms of energy by using proper techniques. For example, solar energy may be converted into electrical energy by a so-called solar cell. The most common solar cells are made of silicon, but cells made of other materials, e.g., cadmium sulfide and gallium arsenide, have also been developed and tested. The required voltage and/or amperage may be generated using an appropriate series-parallel matrix in an integrated array.

At the current state of the art, a principal obstacle to wide scale adoption of solar cell energy collector installations is that manufacturing and installation costs of solar cell arrays generally are substantially higher than the cost of conventional electrical energy generating installations. Another factor limiting wide spread adoption of solar panel cells is radiant heating of the cells which reduces cell efficiency.

While the cost of manufacturing the solar cells per se currently is the single largest cost factor in the manufacture of a solar cell energy collector installation, any technique which increases the overall efficiency of a solar cell energy collector, or which reduces the cost of manufacturing and/or installing a solar cell energy collection system may have significant commercial importance.

In addition to the photoelectric conversion technique just described, it is well known that solar energy may be converted to other more useful forms of energy through thermal conversion techniques. Typically thermal conversion techniques involve using sunlight to heat up a liquid or gas contained in a thermal converter enclosure and then utilizing the heated liquid or gas in an appropriate manner well known to one skilled in the art to generate power.

However, as in the case of solar cells, relatively low energy collection efficiency, relatively high cost of manufacturing and relatively high installation costs have presented a principal obstacle to wide scale adoption of solar thermal energy collectors. Thus, any technique which increases the overall efficiency of a solar thermal energy collector of which reduces the cost of manufacturing and/or installing a solar thermal energy collector system may have significant commercial importance.

One technique the art has developed to increase efficiency of solar cells and thermal converters is to collect and focus solar energy onto the solar cells or thermal converters by means of a so-called "solar concentrator". Thus a typical solar energy collection system may include reflective or refractive devices which are designed to collect solar energy impinging upon a relatively large area and to focus the collected energy onto a relatively small area of utilization.

With respect to these reflectors, problems have been encountered in making them at a reasonable cost. Moreover, prior art reflectors tend to be heavy. There is a need for a reflector used in solar energy collection that is lightweight and reduced cost.

BRIEF SUMMARY OF INVENTION

The present disclosure addresses the needs noted above by providing a foam sandwich reflector for solar energy collection. The foam sandwich reflector comprises a bottom high modulus layer composed of metal and an optically smooth, highly reflective high modulus layer. The foam sandwich reflector also comprises a foam slab having a top surface and a bottom surface. Each of the top surface and the bottom surface of the foam slab have a coating of an adhesive layer. The adhesive layer on the bottom surface of the foam slab is a lower bonding layer that bonds the foam slab to the bottom high modulus layer. The adhesive layer on the top surface of the foam slab is an upper bonding layer that bonds the foam slab to the optically smooth, highly reflective high modulus layer. The reflector is curved in a first dimension, and the curve is configured to concentrate light when the reflector is in use.

These, as well as other objects, features and benefits will now become clear from a review of the following detailed description, the illustrative embodiments, and the accompanying drawings.

BRIEF DESCRIPTION OF DRAWINGS

The accompanying drawings, which are incorporated in and form a part of the specification, illustrate example embodiments and, together with the description, serve to explain the principles of the foam sandwich reflector and method of making the foam sandwich reflector. In the drawings:

FIG. 8 shows a diagrammatic representation of a reflector system that comprises a set of ground mounted reflectors that are arrayed in parallel.

DETAILED DESCRIPTION OF THE INVENTION

The present disclosure is directed to a foam sandwich reflector and a method for making a foam sandwich reflector for solar energy collection.

Figure 1A:
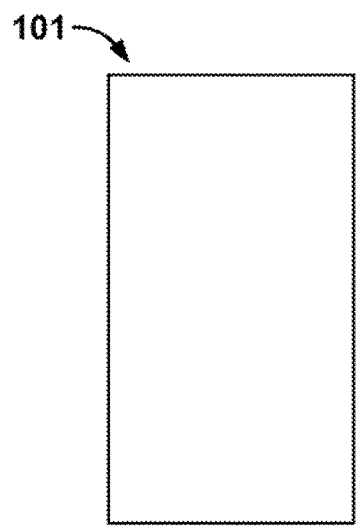
FIG. 1A shows a top view (or "sunny-side" view) of a foam sandwich reflector for the present disclosure.

Referring now to FIG. 1A, illustrated is a top view (or "sunny-side" view) of a foam sandwich reflector 101 in accordance with one embodiment of the present disclosure. Initially, the mirror may appear much like an ordinary flat mirror of the prior art. However, unlike ordinary flat mirrors, this foam sandwich reflector 101 is curved in its multilayer structure. This curvature permits the foam sandwich reflector to concentrate light when the reflector is in use.

Figure 1B:
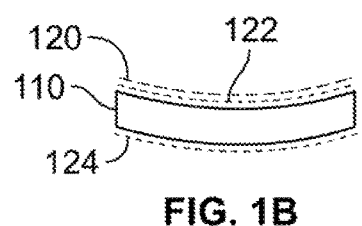
FIG. 1B shows an end view of the foam sandwich reflector of FIG. 1A, which is curved in this dimension.

Referring now to FIG. 1B, illustrated is an end view of the foam sandwich reflector of FIG. 1A. This end view better illustrates how the foam sandwich reflector is curved by its multilayer structure. As illustrated, foam sandwich reflector 101 comprises a foam slab 110, a reflecting surface layer 120, a top high modulus layer 122, and a bottom high modulus layer 124. The foam slab 110 may be bonded between the top high modulus layer 122 and the bottom high modulus layer 124. The top reflecting surface layer 120 may be bonded to the top high modulus layer 122.

The foam slab 110 may be composed of a low to medium density polymer foam material. Examples of such low to medium density polymer foam materials include without limitation, types of Styrofoam®, e.g., expanded polystyrene foam (EPS) (readily available in the density range of about 15 kg/m$^3$ to 40 kg/m$^3$), and extruded polystyrene foam (XPS) (readily available in the density range of about 28 kg/m$^3$ to 45 kg/m$^3$). Examples of low to medium density foam materials also include polyvinyl chloride (PVC) foam (readily available in the density range of about 80 kg/m$^3$ to 160 kg/m$^3$ (5 to 10 lb/ft$^3$)), and rigid polyurethane foam. Hence the range of available foam densities for low to medium density polymer foam is at least about 15 kg/m$^3$ to about 160 kg/m$^3$. The higher density foams may correspond with higher strength sandwich structures, while the lower density foams may correspond with low cost.

For applications which are highly cost sensitive yet somewhat demanding of strength, the foam slab 110 may comprise extruded polystyrene foam (XPS). This foam has closed cells, and may offer improved surface roughness as well as higher stiffness.

It is important to note that the above-referenced polymer foams may be desired, rather than honeycomb materials (e.g. aluminum or graphite or glass) which may be sought after in the prior art. The prior art preference may stem from the desire for ultimate optical performance and thermal stability.

The present foam sandwich reflector has greatly relaxed optical performance requirements, thus permitting it to effectively use the much lower cost polymer foams. Hence a lower cost overall system is made possible. Thus, the present foam sandwich reflector 101 may be useful in moderate concentration optics. For purposes of the present disclosure, moderate concentration optics means light gathering systems with concentration ratios generally below 400:1 and extending down to 1:1. For example, the concentration ratio of a heliostat is 1:1. As is known in the art, the concentration ratio is the ratio of the area of the collector aperture to the surface area of the receiver. The concentration ratio is light intensity relative to unconcentrated sunlight. The light intensity of unconcentrated sunlight is approximately one thousand Watts per meter squared (1000 W/m$^2$).

In order to reduce manufacturing cost, the foam slab 110 prior to assembly may be a substantially rectangular solid shape. Rectangular shapes of foam may be readily available at high volume (low price) cost. As will be described later in this disclosure, this rectangular shape can be transformed into a concentrating shape by a low cost process by molding to a form.

Alternatively, one can modify a rectangular solid shape of foam prior to assembly of the foam slab 110. In this option, the foam slab 110 prior to assembly is cut, for example by hot-wire slicing, to remove a cylindrical-parabolic section from its upper surface. Thus, the rectangular shape is now minus the cylindrical-parabolic section from its upper surface. This option may aid in minimizing the stress built into the final laminated sandwich. This option may be desirable when the foam sandwich reflector is destined for a high temperature application (e.g., in a desert location) where concerns about long-term thermal-mechanical stability are dominant.

In some applications the foam slab 110 may be a substantially elongated shape. This elongated shape (e.g., length to width ratio exceeding two (2)), which illustrates its difference from the prior art dish shape.

This quasi-trough shape is bent in only one axis, whereas the prior art dish shape was bent in two axes. Key to this class of shapes (troughs) is the fact that it may be much easier to bend an initially flat slab into a slightly curved shape if the bend is only a one-dimensional bend rather than a two-dimensional bend (i.e. bent along one axis only rather than bent along two axes simultaneously). By "easier," we mean the stresses induced into the slab are much lower for a given amount of deflection or bending. However, it should be understood that if one starts with a slab which has been bent in a single dimension it is possible to add a relatively small amount of bending in the perpendicular dimension without adding undue stress to the slab. By relatively small amount is meant a factor of 10 or less bending. In other words, the radius of curvature of such a second dimensional bend would be 10 times larger than the radius of curvature of the first dimensional bend. The class of shape described herein is more of a "quasi-trough."

The top high modulus layer 122 and the bottom high modulus layer 124 may be composed of a metal, e.g., aluminum or galvanized steel. Although aluminum may be more expensive than steel, aluminum may be purchased in thinner layers. Thus, as far as cost, in some situations, aluminum may be comparable to steel as a material choice. The top high modulus layer 122 and the bottom high modulus layer 124 may also be composed of glass. As used herein, "high modulus" may refer to materials with a high elastic modulus of about ten gigapascals (10 GPa). Glass may have a modulus of about fifty (50) to ninety (90) GPa.

Figure 1C:
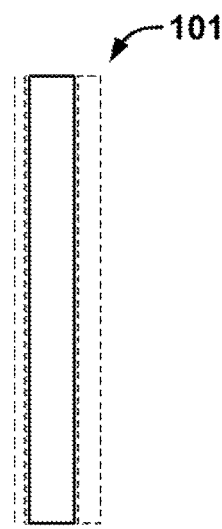
FIG. 1C shows a side profile of the foam sandwich reflector.

Referring now to FIG. 1C, illustrated is a side view of the foam sandwich reflector of FIGS. 1A and 1B. As shown in this side view, the foam sandwich reflector 101 has a narrow side profile. As shown, the side profile is also essentially straight.

Figure 2A:
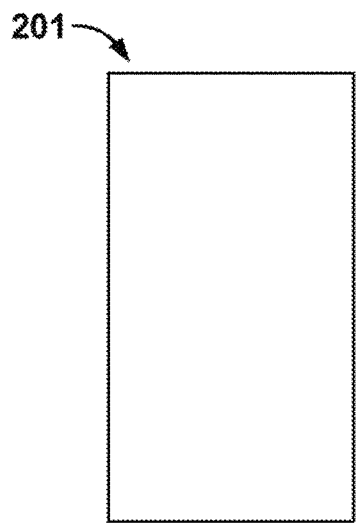
FIG. 2A shows a top view (or "sunny-side" view) of a foam sandwich reflector in accordance with one embodiment of the present disclosure.
Figure 2B:
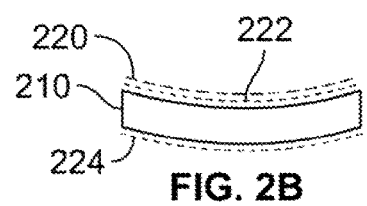
FIG. 2B shows an end cross-sectional view of the foam sandwich reflector of FIG. 2A, at mid-section, curved in one dimension.
Figure 2C:
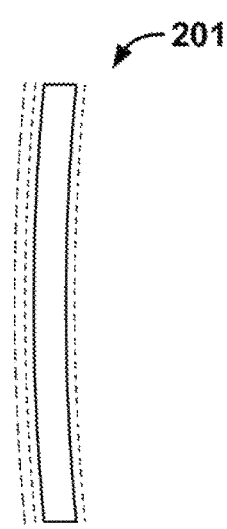
FIG. 2C shows a side cross-sectional view, at mid-section, curved in a second dimension of the foam sandwich reflector.

FIG. 2A shows a top view (or "sunny-side" view) of a foam sandwich reflector 201 in accordance with one embodiment of the present disclosure. As used herein, "top" may be used interchangeably with "sunny-side." FIG. 2B shows an end cross-sectional view (at mid-section) and FIG. 2C shows a side cross-sectional view (at mid-section). This foam sandwich reflector 201 is curved by its multilayer structure, with a dominant relatively high curvature concave curve in a first direction (shown in FIG. 2B) and relatively small curvature convex curve in a second perpendicular or orthogonal direction (shown in FIG. 2C). Foam sandwich reflector 201 comprises a foam slab 210, a reflecting surface layer 220, a top high modulus layer 222, and a bottom high modulus layer 224. The foam slab 210 is bonded between the top high modulus layer 222 and the bottom high modulus layer 224. The reflecting surface layer 220 is bonded to the top high modulus layer 222.

The reason this quasi-trough shape is important is that it solves a fundamental optical problem of shadowing that occurs when using concentrating apertures with segmented reflectors. For example, a linear concentrator for a photovoltaic array may have a series of reflector segments separated by gaps. When the light is concentrated onto the photovoltaic array, the gaps in the linear reflector aperture will present themselves as shadows (i.e. regions of relatively small levels of light flux). The shadow regions may be made worse due to uneven ground on which the reflector segments may be mounted. As is well known in the art of solar cell modules, when shadows are cast onto regions of the modules, undesirable results may occur. At the very least, the electrical output of the solar module may be very substantially reduced since the regions of shadows cause greatly diminished amounts of currents to be supported. It is also quite possible that the module can be destroyed by a well-known heating process that can occur as a result of shadowing (especially if the module is not protected by by-pass diodes). Thus, shadowing should be avoided, if possible, for both performance and durability reasons.

In order to greatly reduce or even eliminate shadows due to gaps in the abovementioned linear concentrator, a slight convex curvature may be imposed in the long direction of a linear reflector.

Figure 3:
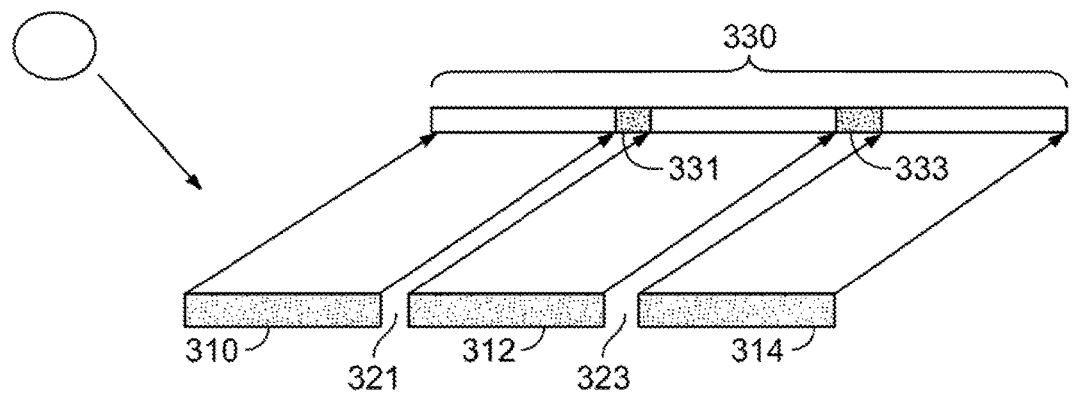
FIG. 3 illustrates a side view of reflector segments that are separated by gaps.

Referring now to FIG. 3, illustrated is a side view of reflector segments 310, 312 and 314 that are separated by gaps 321 and 323. It may be impractical to provide a mirror that is as long as needed for the reflector. For example, an entire receiver may need to be fifty feet (50') long. Conventional mirrors may be much shorter, e.g., eight feet (8') long. Accordingly, multiple mirrors may be provided as segments 310, 312, 314, and the gaps 321, 323 may be disposed there between. The segments 310, 312, 314, may be supported by bearings and support posts. It may be desirable for the support structures for the reflector segments to be rotatable in order to accommodate changes in elevation in locations where the segments 310, 312, 314 are mounted. The reflector segments 310, 312 and 314 concentrate sunlight to a line focus 330. The line focus 330 is where the light is intended to be directed from the reflectors 310, 312, 314. The reflector segments 310, 312 and 314 are concave in the direction into the illustration or screen (if viewed on a computer screen) or paper (if viewed on paper), but essentially flat along their long direction (in the plane of the paper, screen or illustration from left to right). While the sunlight gets focused in the one direction onto line focus 330, since there are gaps 321 and 323 between the segments, light is not directed to shadows 331 and 333. As noted above, the shadows could cause deleterious effects if the concentrator were used with a typical solar receiver module. To overcome this optical challenge, a slight bowing (or convex shaping) may be applied to the concentrator segments.

Figure 4:
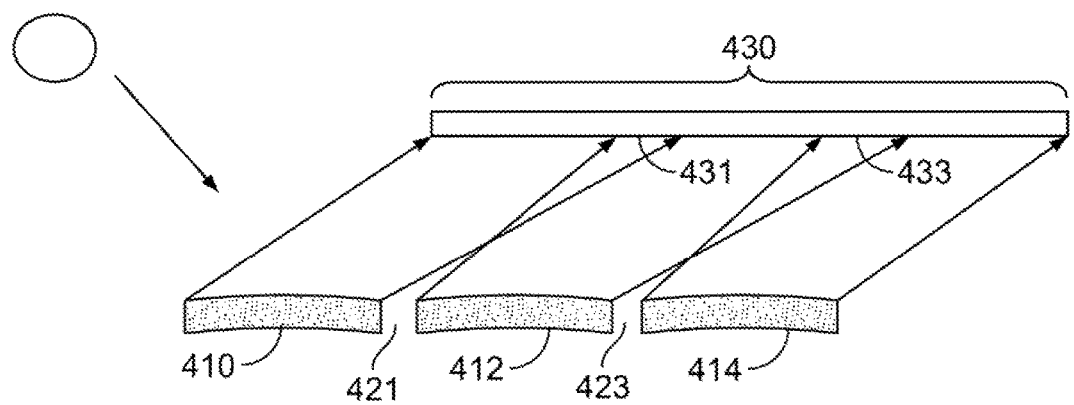
FIG. 4 illustrates a side view of bowed reflector segments which are separated by gaps in accordance with one embodiment of the present disclosure.

Referring now to FIG. 4 illustrated is a side view of reflector segments 410, 412 and 414 which are separated by gaps 421 and 423. The reflector segments 410, 412 and 414 concentrate sunlight to a line focus 430. The reflector segments 410, 412 and 414 are concave in the direction into the paper, but now are slightly bowed upward (i.e. convex) along their long direction (in the plane of the paper, screen or illustration, from left to right). The sunlight again gets focused in the one direction onto line focus 430. But now, even though there are gaps between the segments (gaps 421 and 423), light is not directed to create any shadows in focal line regions 431 and 433. Instead, the bowed shape of reflector segments 410, 412 and 414 spreads the light in along the focal line, hence tending to fill in the focal line regions 431 and 433.

Figure 5:
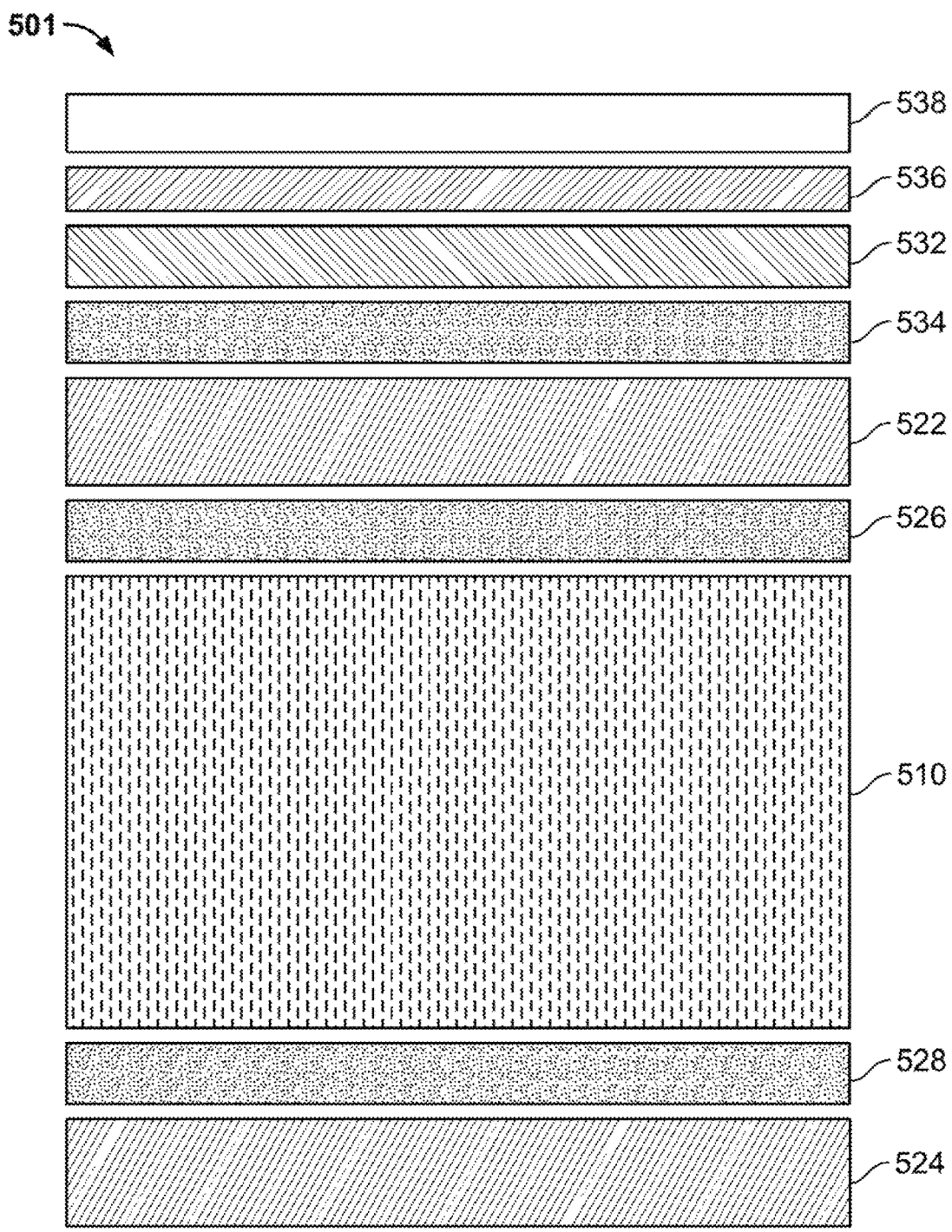
FIG. 5 shows an exploded schematic side view of a multilayer foam sandwich reflector in accordance with one embodiment of the present disclosure.

Referring now to FIG. 5, illustrated is an exploded side view of a foam sandwich reflector 501 in accordance with one embodiment of the present disclosure. Foam sandwich reflector 501 comprises a foam slab 510, a top high modulus layer 522, a bottom high modulus layer 524, an upper bonding layer 526, a lower bonding layer 528, a top/upper bonding layer 532, a glue layer 534, a reflecting surface layer 536 and a window layer 538.

The plastic layer 532 may have an aluminum mirror vacuum-metallized on the surface of it using physical vapor deposition (PVD). This vacuum-metallization permits the plastic layer 532 to bond to the reflecting surface layer 536. In this respect, aluminum may be evaporated inside a vacuum chamber. The aluminum atoms may then fly at high velocity to the surface of the plastic layer 532. When the high speed atoms hit the plastic layer 532, the plastic may heat up and cause the aluminum to bond to the plastic layer 532 which may then bond to the reflecting surface layer 536, thus resulting in a uniform metalized layer. The aluminum mirror may act as the reflecting surface layer 536. Other mirrors may also be suitable for the reflecting surface layer as long as most of the light is reflected by the reflecting surface layer. In lieu of the aluminum mirror, other materials may be used for the reflecting surface layer. For example, silver—common in household mirrors—may be used for the reflecting surface layer. Dielectric layers could also be used for the reflecting surface layer 536. The window layer 538 may act as a protective layer.

The foam slab 510 is bonded via an upper bonding layer 526 to the top high modulus layer 522. Similarly, the foam slab 510 is bonded with a lower bonding layer 528 to the bottom high modulus layer 524. The upper bonding layer 526 and the lower bonding layer 528 may be comprised of a glue e.g., epoxy. The reflecting surface layer 536 is bonded to the top high modulus layer 522 with top bonding layer 532. Optionally, the reflecting surface layer 536 is protected by window layer 538. Window layer 538 may be a clear coating, and may act as a protective layer. The clear coating of window layer 538 may be similar to the top coats used for automobile paint jobs. At one point, these coatings were acrylics. See, e.g., U.S. Pat. No. 4,307,150 A1 to Roche. More recently, they are urethane-based. The clear coating should be sufficiently clear to allow enough light through it. If more than ninety percent (90%) of the light is allowed to go through, this may be sufficient.

The foam slab 510 may be about two centimeters (2 cm) to about ten centimeters (10 cm) thick, or even thicker. Optimally, the foam slab may be about five (5) centimeters thick for a reflector that is about sixty centimeters (60 cm) wide and two hundred forty centimeters (240 cm) long. This slab thickness results in a sandwich structure which is not only very stiff against flexure along its length, but the sandwich structure is also very stiff against twisting action along its long axis. In other words, the sandwich structure acts like a stiff torque tube for transferring rotational torque along its long axis. This inherently high torque rigidity performance and high structural stiffness and strength result in a reflector that can be used without the need for the typical external space lattice support structure which is typically required by the prior art.

For applications where low cost and light weight are both important, the reflecting surface layer 536 may comprise a metallization layer of roughly one hundred (100) nanometers (nm) thickness or greater. This minimum thickness permits the reflecting surface layer 536, when composed of aluminum, to be reflective. It may be desirable also for the reflecting surface layer 536 to have an optical density on transmission of 2.0 or more opaque. In this manner, as much as ninety-nine percent (99%) of the light that hits the reflecting surface layer 536 may be blocked and mostly reflected when tested for transmission of light. The metallization layer of the reflecting surface layer 536 should be deposited on a polymer substrate 532 which is about twelve (12) microns to two hundred (200) microns thick.

The foam sandwich reflector 501 may comprise a setting-type adhesive layer for upper bonding layer 526 between the foam slab 510 and the top high modulus surface layer 522 and, a setting-type adhesive layer for lower bonding layer 528 between the foam slab 510 and the bottom high modulus surface layer 524. An example of such a setting-type adhesive is a two-part epoxy where two chemicals are mixed together and given a reaction time to become set. The reflecting surface layer 536 may be bonded to the top high modulus layer 522 with a thermosetting permanent adhesive for the top bonding layer 534. This thermosetting permanent adhesive may be cured using heat and/or heat and pressure as is known in the art. Pressure-sensitive adhesive may not be desirable for the large loads and permanency needed for the bonding layers needed for the present foam sandwich reflector.

In lieu of providing the top five layers of FIG. 5, i.e., the top high modulus layer 522, the glue bond layer 534, the plastic layer 532, the reflecting surface layer 536 and the protective layer 538, a single layer may be provided. This single layer may incorporate all the features of the five layers to provide a single optically smooth, highly reflective, high modulus protective layer. This single layer should be highly reflective, e.g., greater than eighty percent (80%) reflectivity over a one degree (1°) angle. Such a single layer may be known as PVD coating (or reflectivity enhancing oxide layers) and may be commercially available from companies such as Alanod® GmbH & Co. KG under the trade names Miro® and Miro-Silver®. The optical smoothness should also have more than eighty percent (80%) specular reflectivity over a one degree (1°) angle. Combining all of these five layers i.e., the top high modulus layer 522, the glue bond layer 534, the plastic layer 532, the reflecting surface layer 536 and the protective layer 538, into a single layer may result in a much more expensive foam sandwich reflector.

Figure 6:
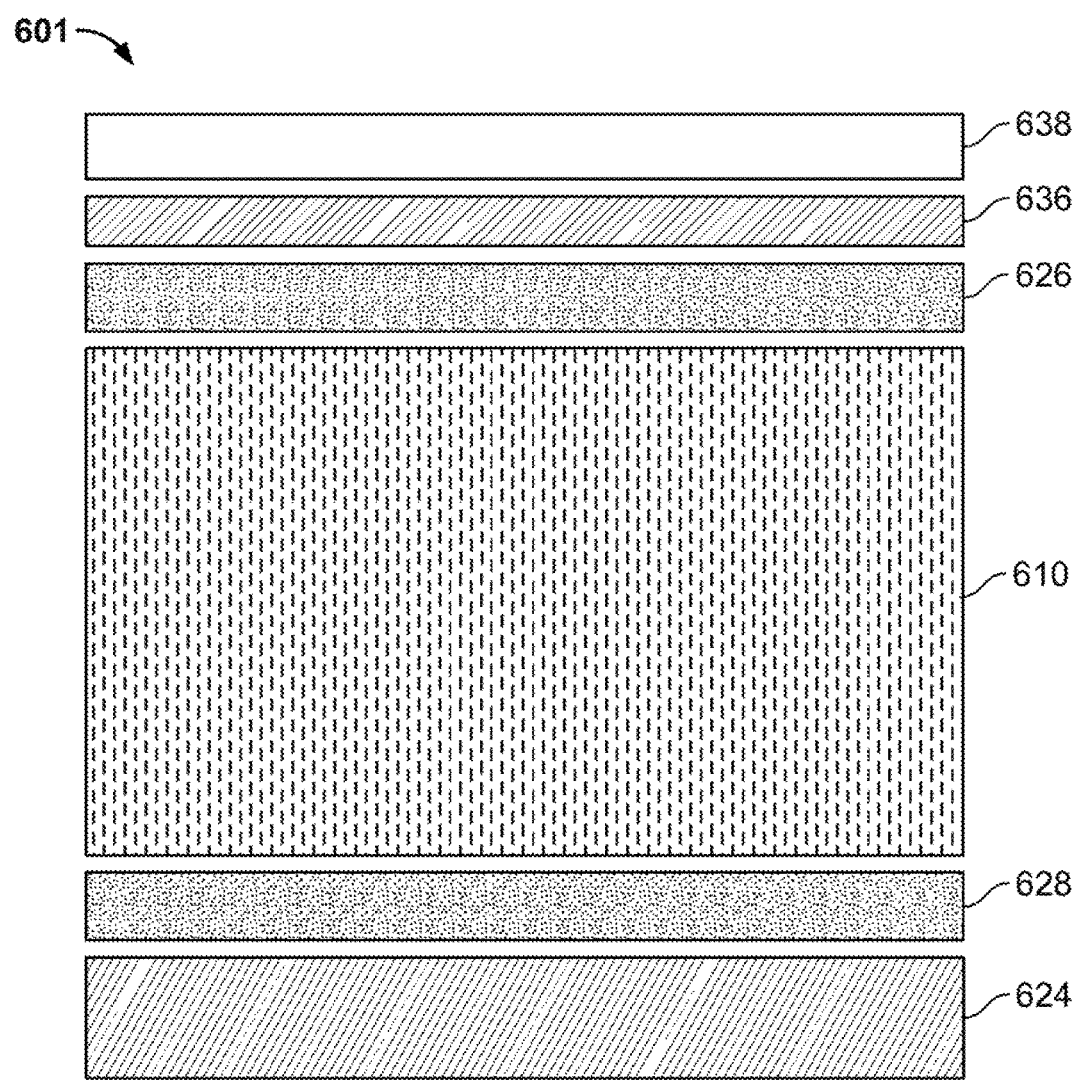
FIG. 6 shows an exploded schematic side view of a multilayer foam sandwich reflector in accordance with another embodiment of the present disclosure.

Referring now to FIG. 6, illustrated is a side view of a foam sandwich reflector 601 in accordance with another embodiment of the present disclosure. Foam sandwich reflector 601 comprises a foam slab 610, a bottom high modulus layer 624, a reflecting surface layer 636, and a top high modulus layer which in this example is a window layer 638. The foam slab 610 is bonded with an upper bonding layer 626 to the reflecting surface layer 636 which itself is adhered to the bottom of the window layer 638. Similarly, the foam slab 610 is bonded with a lower bonding layer 628 to the bottom high modulus layer 624.

For applications where durability against abrasion from weather and cleaning are most important, the reflecting surface layer 636 may comprise a metallization layer of roughly 100 nm thickness or greater deposited on window layer 638 which may be a glass superstrate. The glass superstrate that makes up the window layer 638 may be about 1 millimeter (mm) to 4 mm thick, and the glass superstrate self-provides the top high modulus surface layer which in this example is the window layer 638. Window layer 638 may be abrasion-resistant glass, or window layer 638 may be a polymer or acrylic. The bottom high modulus layer 624 may comprise a material other than glass. While glass may be suitable for the window layer 638 in terms of thermal expansion, it may be desirable to employ a less brittle material for the bottom high modulus layer 624, for example a metal. Possible metals for the bottom high modulus layer 624 include galvanized steel and aluminum. Other options for the bottom high modulus layer 624 include fiberglass, though this material would generally be more expensive and hence usually less desirable. If glass is not used for the bottom high modulus layer 624, the reflector of the present disclosure can be inverted during a severe weather event, e.g. hail, and survive whereas a glass layer might not.

Figure 7:
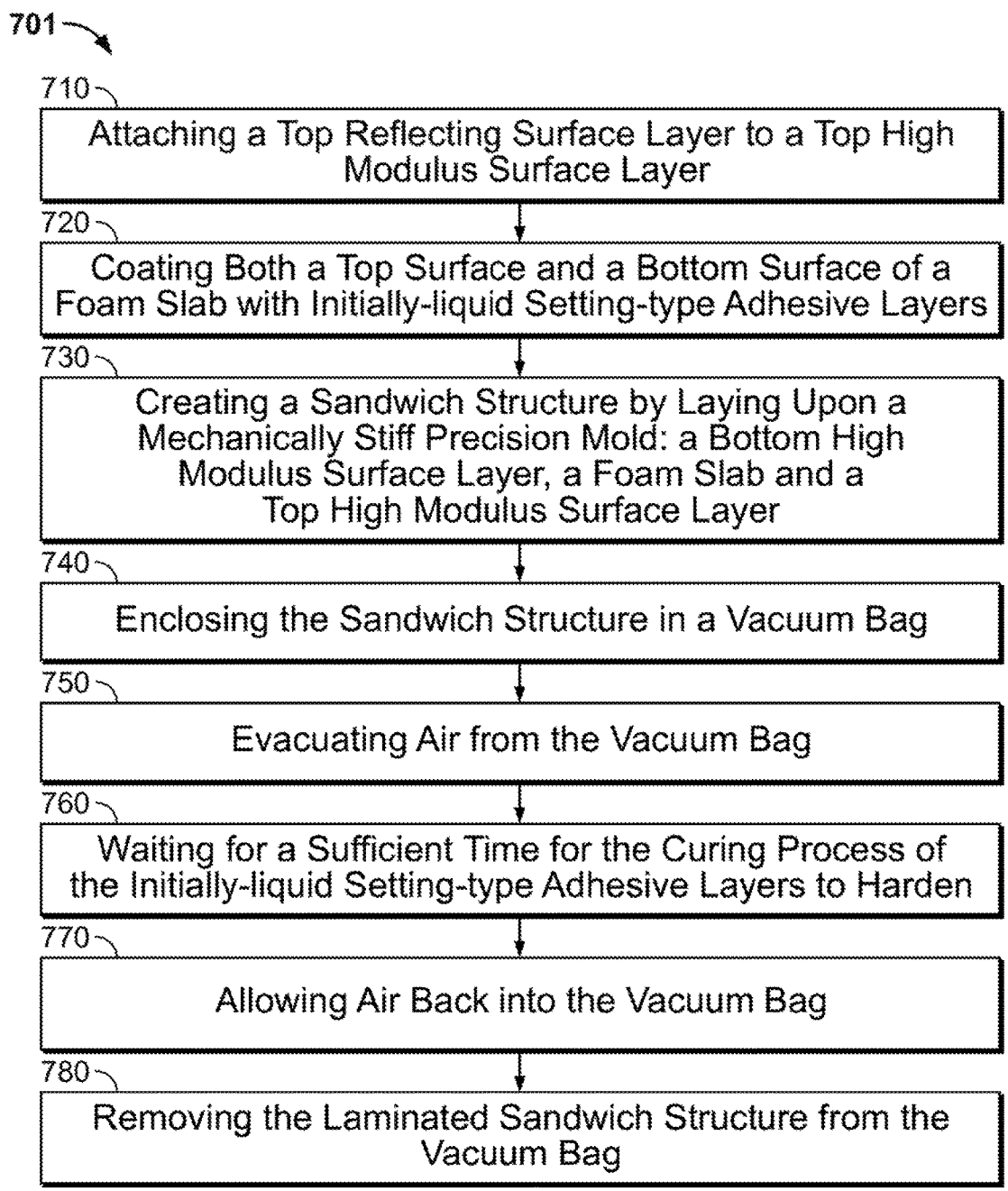
FIG. 7 shows a flow chart for a method of creating a foam sandwich reflector in accordance with one embodiment of the present disclosure.

Referring now to FIG. 7, illustrated is a method of laminating a foam sandwich reflector. The method comprises the steps 710 through 770 as follows. At step 710, the method includes attaching a reflecting surface layer to a top high modulus surface layer by coating a thermosetting bonding initially-liquid layer to the top high modulus surface layer. This attaching step 710 may include applying the reflecting surface layer under conditions of high pressure and suitable temperature to the coated top high modulus surface layer. The preferred temperature is about room temperature because more elevated temperatures may warp the molds thereby destroying the quality of the resulting foam sandwich reflector. The pressure range is at least one (1) pound per square inch (psi) and preferably more than four (4) psi.

At step 720, the method includes coating both a top surface and a bottom surface of a foam slab with initially-liquid setting-type adhesive layers. At step 730, the method includes creating a sandwich structure by laying upon a mechanically stiff precision mold the following in sequence: a bottom high modulus surface layer; the foam slab with both top and bottom surface previously coated with setting-type adhesive, and the top high modulus surface layer to which the reflecting surface layer has been previously attached. A precision mold is a precise curved mold which can be made of metal. These foam sandwich layers are laid into the mold. The precision mold is mechanically stiff so that it maintains its shape. At step 740, the method includes enclosing the sandwich structure in a vacuum bag.

At step 750, the method includes evacuating air from the vacuum bag thereby squeezing the sandwich structure and causing all of the sandwich parts to conform to the shape of the mechanically stiff precision mold. This happens due to air pressure. At step 760, the method includes waiting for a sufficient time for the curing process of the initially-liquid setting-type adhesive layers to harden. At step 770, the method includes allowing air back into the vacuum bag. This step may be performed by simply opening the vacuum bag to allow air back in. Finally, at step 780, the method includes removing the now laminated foam sandwich reflector from the vacuum bag.

Referring now to FIG. 8, illustrated is a diagram of a reflector system 801 that comprises a set of ground mounted reflectors 810₁, 810₂, through 810ₙ, that are arrayed in parallel. The reflectors 810₁, 810₂, through 810ₙ may be driven collectively or individually, to track movement of the sun relative to the earth. The reflectors orientated to reflect incident solar radiation to a receiver 830.

Figure 9A:
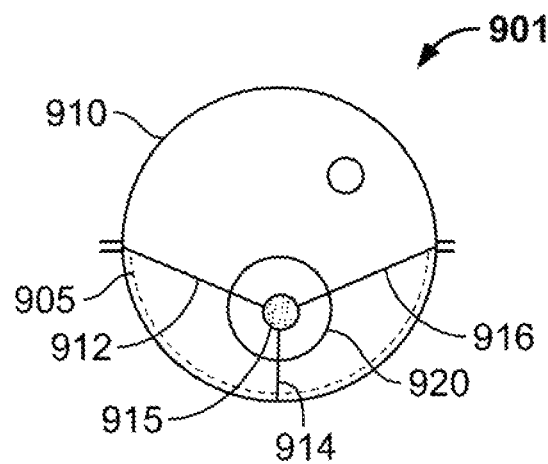
FIGS. 9A-9D illustrate several views of an embodiment of a solar collector system into which the foam sandwich reflector may be incorporated.
Figure 9B:
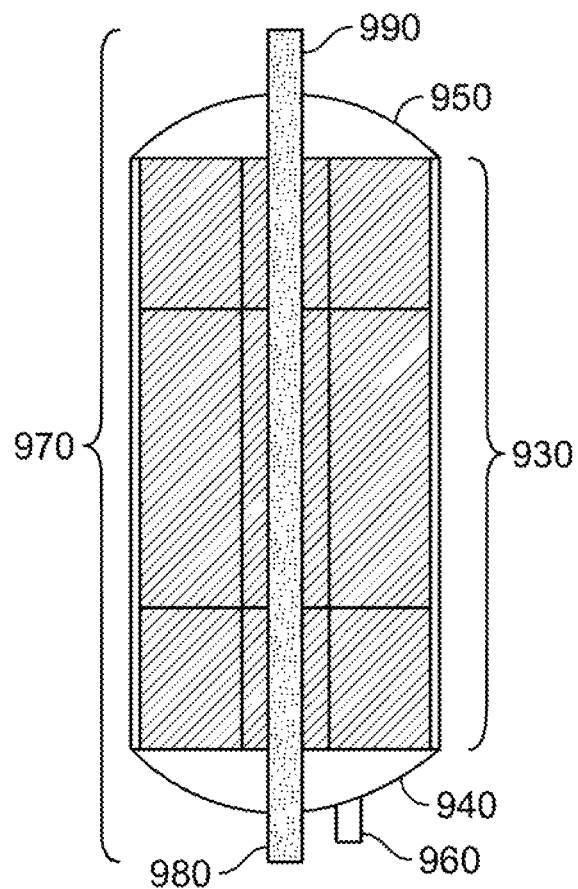

Referring now to FIG. 9A, illustrated is an end view of a solar energy collector that can be used with the present foam sandwich reflector. FIG. 9B is a top view of the solar energy collector of FIG. 9A. The length of the collector can be relatively short as illustrated or very much longer depending on particular application needs.

Solar energy collector 901 comprises a reflector 905 with a concentrating shape, which in this case is approximately the shape of a section of a cylindrical tube. The cylindrical shape is a specific example of an approximately constant cross-section shape. The cylindrical shape is a specific example of a surface with substantial curvature in only one dimension. Reflector 905 is held in place and in shape by window sheet 910 which is an example of a first support means for the reflector 905. By itself, reflector 905 would not be able to maintain its shape against the force of gravity since it is very thin and hence very flexible. The window sheet 910 is sealed against the long edges (lengthwise edges) of reflector 905 to form a substantially leak-tight cylindrical structure 930 when pressurized within by a suitable gas (such as air).

To form a completely sealed vessel, the short ends (lateral edges) of the cylindrical structure 930 can be simply sealed (not illustrated), or sealed by attaching to seal end 940, a first bulkhead and seal end 950, a second bulkhead. The bulkheads can be constructed of thick and hence rigid materials (e.g. wood, plastic, metal etc.) or of thin flexible materials. Seal end 950 can also comprise an input port 960 to enable pressurization of the interior of the vessel 970. Seal end 940 can also comprise a fluid input 980 and seal end 950 can also comprise a fluid output 990 to provide cooling fluid to receiver 915 which is an example of a receiving zone.

The reflector 905 and window sheet 910 may be polymer (e.g. polyester terephthalate (PET)) film with a thickness under 250 μm. For added lifetime, the reflector 905 and window sheet 910 may also be protected by a thin topcoat of acrylic containing ultraviolet (UV) light blockers, stabilizers, or brighteners or the like as are well known in the art of sunlight stabilization of polymers. To provide light reflecting characteristics to reflector 905 a metallized (e.g. aluminum) layer may be included. Solar energy collector 901 also comprises a receiver 915 which is an example of a receiving zone.

Solar energy collector 901 can optionally comprise a glazed tube 920. Glazed tube 920 will sometimes be desirable when collector 901 is used to collect sunlight in the converted energy to form heat.

Figure 9C:
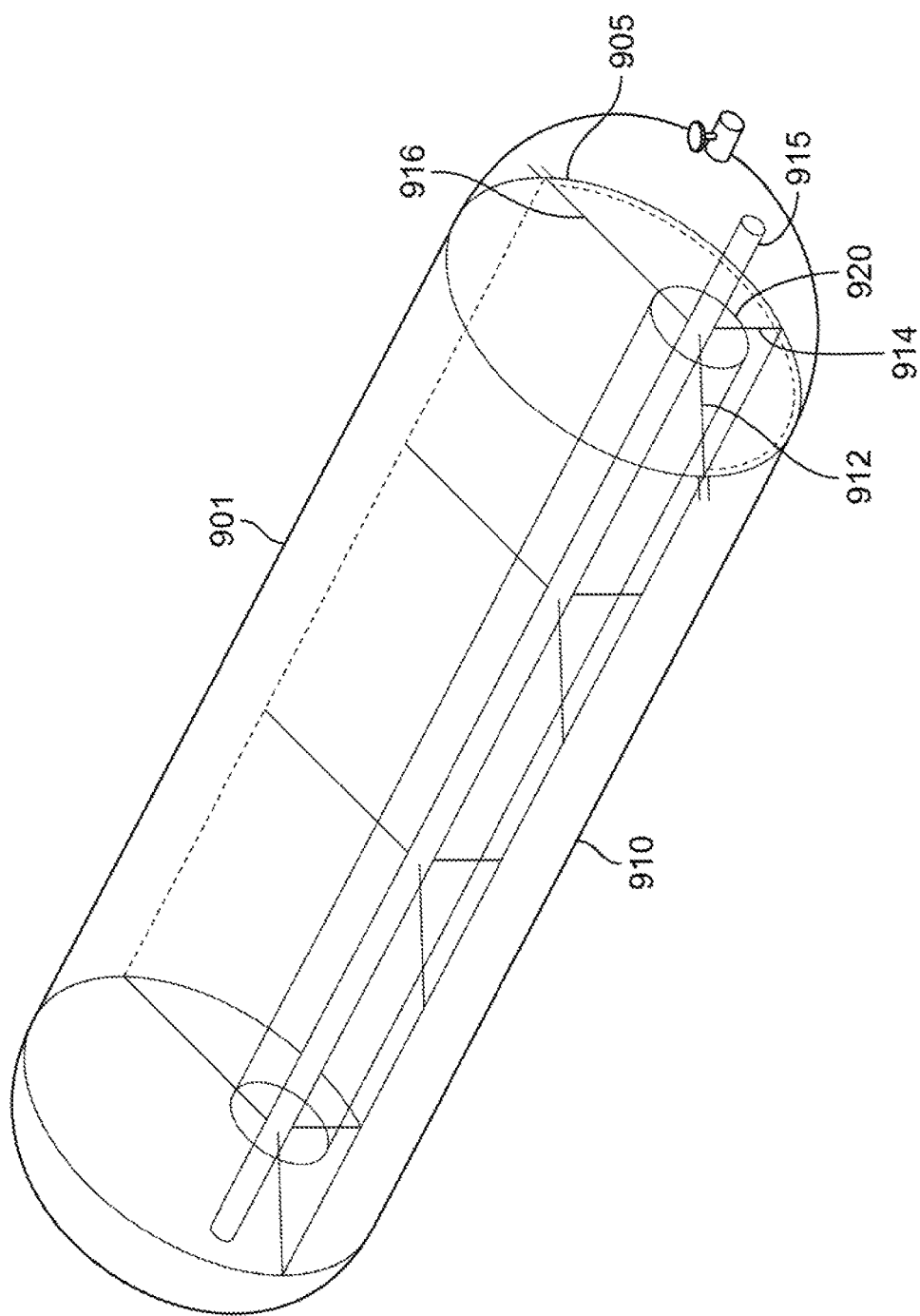

FIG. 9C shows a perspective or isometric view of the solar energy collector assembly 901, which in one embodiment comprises a sealed and inflated cylindrical-tube shaped housing 901. As shown in FIG. 9C, the solar collector assembly 901 comprises a sealed and inflated cylindrical-tube shaped housing. The tube housing includes a bottom cylindrically-trough shaped reflector portion having a reflection surface extending along a longitudinal length. The reflection surface may be made of a relatively thin and flexible metalized polymer film.

The assembly 901 further includes a top cylindrically-shaped transparent polymer film sheet portion made of a relatively thin and flexible polymer film. The top and bottom sheet portions form a pressure sealed cylindrical tube housing when the respective ends of the top and bottom films are sealed together and the tube housing is inflated with a gas via valve 930 so that the top transparent film portion passes solar energy to the reflection surface. The collector assembly shown in FIG. 9C further includes a receiver tube disposed longitudinally above the reflection surface in a focal line or focal plane of the cylindrical-trough shaped reflector portion. The absorber tube extends along the longitudinal length of the reflection surface, and contains a heat transfer fluid for absorbing solar energy reflected from the reflection surface to the focal line or focal plane.

Figure 9D:
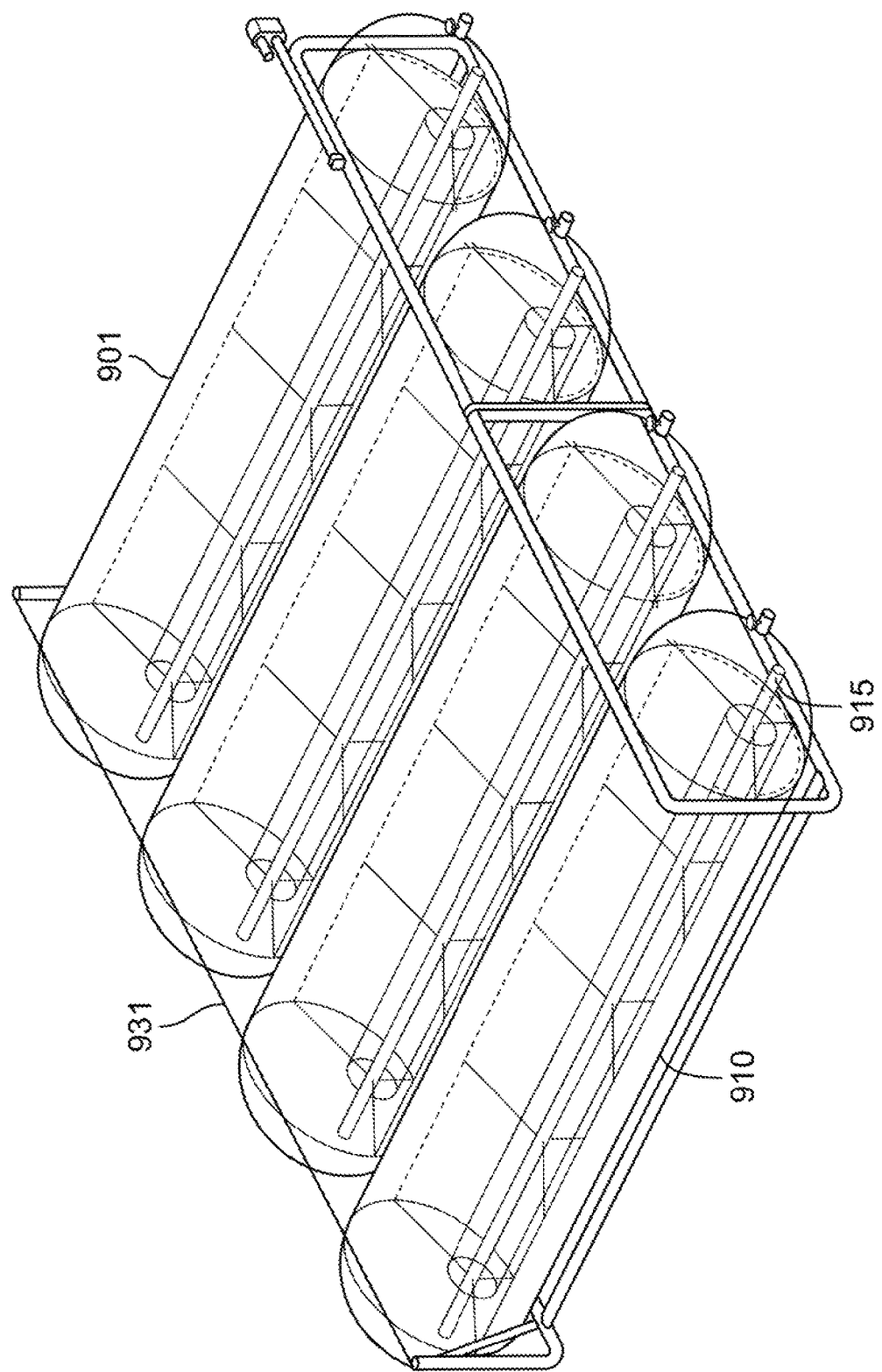

FIG. 9D is a perspective view of a solar energy collector array, in which four solar collector assemblies 901 are combined in an array configuration. The solar collector array shown in FIG. 9D is supported by support frame 940 and can be moved by a suitable drive/tracking system 950. FIG. 9D is suitable for mounting on a support structure, such as the roof of a building, a ground surface open area, or the like. Optional restraint line 931 is shown attached at two points of support frame 940. The restraint line 931 can be used to ensure that collector assemblies 901 remain located atop support frame 940 even in the presence of strong winds. The restraint line 931 may be made of lightweight yet strong material (e.g. nylon rope or steel cable).

The foregoing description of various embodiments has been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A foam sandwich reflector for solar energy collection, comprising:
   a bottom high modulus layer composed of non-glass material;
   an optically smooth, highly reflective high modulus layer, wherein the optically smooth, highly reflective high modulus layer includes, in sequence:
      a top high modulus layer composed of glass;
         a glue layer attached to the top of the top high modulus layer;

a plastic layer attached to the glue layer;
a reflecting surface layer, wherein the reflecting surface layer is attached to the plastic layer;
a protective layer disposed on top of the reflecting surface layer,
wherein the protective layer has a substantially clear coating; and
a solid foam slab having a top surface and a bottom surface, wherein each of the top surface and the bottom surface of the foam slab have a coating of an adhesive layer, wherein the adhesive layer on the bottom surface of the foam slab is a lower bonding layer that bonds the foam slab to the bottom high modulus layer, and wherein the adhesive layer on the top surface of the foam slab is an upper bonding layer that bonds the foam slab to the optically smooth, highly reflective high modulus layer; and
wherein the reflector has a curve in a first dimension and the curve is configured to concentrate light when the reflector is in use.

* * * * *